US008648678B2

(12) United States Patent
Aubert

(10) Patent No.: US 8,648,678 B2
(45) Date of Patent: Feb. 11, 2014

(54) COMPACT SUPERCONDUCTING MAGNET DEVICE

(75) Inventor: Guy Aubert, Poitiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/810,481

(22) PCT Filed: Jul. 8, 2011

(86) PCT No.: PCT/FR2011/051629
§ 371 (c)(1),
(2), (4) Date: Mar. 21, 2013

(87) PCT Pub. No.: WO2012/007679
PCT Pub. Date: Jan. 19, 2012

(65) Prior Publication Data
US 2013/0265124 A1    Oct. 10, 2013

(30) Foreign Application Priority Data
Jul. 16, 2010   (FR) ...................................... 1055816

(51) Int. Cl.
*H01F 1/00*      (2006.01)
*H01F 6/00*      (2006.01)
(52) U.S. Cl.
USPC ........................................................ 335/216

(58) Field of Classification Search
USPC .......................................................... 335/216
See application file for complete search history.

(56) References Cited

U.S. PATENT DOCUMENTS

| | | | | |
|---|---|---|---|---|
| 3,393,386 A | * | 7/1968 | Hintz | ............................ 335/216 |
| 4,584,548 A | | 4/1986 | Inoue et al. | |
| 4,843,333 A | * | 6/1989 | Marsing et al. | ............... 315/503 |
| 5,570,073 A | * | 10/1996 | Muller | ........................... 335/299 |
| 6,084,497 A | | 7/2000 | Crozier et al. | |
| 6,580,346 B1 | * | 6/2003 | Takeshima et al. | ............ 335/216 |
| 6,774,752 B2 | * | 8/2004 | Schlenga et al. | ............... 335/216 |
| 6,856,223 B1 | * | 2/2005 | Takeshima et al. | ............ 335/301 |
| 7,292,040 B2 | * | 11/2007 | Kakugawa et al. | ............ 324/319 |
| 8,258,903 B2 | * | 9/2012 | Schnur | .......................... 335/216 |
| 2009/0261246 A1 | | 10/2009 | Neuberth et al. | |

* cited by examiner

*Primary Examiner* — Alexander Talpalatski
(74) *Attorney, Agent, or Firm* — The Webb Law Firm

(57) ABSTRACT

Disclosed is a compact superconducting magnet device for generating an intense and homogeneous magnetic field component Bz along an axis Oz in a zone of interest ZI successively includes, starting from the axis Oz, at least three coaxial superconducting helical coils formed around circular cylinder sections of axis Oz delimited by end circles. The lateral ends of the helical coils are arranged, to within the thickness of the coils, in the vicinity of one same sphere of radius c whose centre O is placed on the axis Oz at the centre of the zone of interest ZI and which encompasses the magnetic device assembly. The azimuthal current densities $j_1$, $j_2$, $j_3$ of the helical coils are alternately of opposite sign. The lengths of the helical coils are of decreasing length.

5 Claims, 2 Drawing Sheets

COMPACT SUPERCONDUCTING MAGNET DEVICE

FIELD OF THE INVENTION

The subject of the present invention is a compact superconducting magnet device capable of producing an intense, homogeneous magnetic field Bz along an axis Oz in a zone of interest ZI which may be of large volume e.g. for applications in nuclear magnetic resonance (NMR) or magnetic resonance imaging (MRI).

The invention also concerns a method for producing said compact superconducting magnet device.

PRIOR ART

The manufacture of magnets producing a highly homogeneous magnetic field within a sizeable volume, in particular for NMR or MRI, entails the use of specific magnetic configurations which may prove to be very difficult to carry out. Hence the idea of seeking a magnet structure that is simple and easy to use with accuracy, such as a winding of helical layers sufficiently long so that the transitions from one layer to the next and the inevitable junctions between successive lengths of conductors are positioned sufficiently distant from the volume of interest so as not to disturb the computable theoretical homogeneity of the helical coil.

A helical coil is not axisymmetric but the pitch of the helix is generally sufficiently small so that resulting differences compared with a theoretical axisymmetric coil are negligible. In addition, it is possible to choose the number of turns per layer and the number of layers so that near-perfect compensation of these differences is obtained. The remainder hereof shall therefore be limited to purely axisymmetric configurations of axis Oz also having symmetry relative to their median plane xOy. The expansion in spherical harmonics (ESH) of the field component $B_z$ in the inner zone of interest ("bore" of the magnet) then assumes the following very simple form:

$$B_z = Z_0 + \sum_{p=1}^{\infty} Z_{2p} r^{2p} P_{2p}(\cos\vartheta)$$

This ESH is valid inside the largest sphere of centre O and not containing any current or magnetized material.

It is easily shown that the relative coefficients $$\frac{Z_n}{Z_0}$$

of this ESH are decreasing functions of the minimum radius $a_1$ of the coil as $$\frac{1}{a_1^n}.$$

Therefore, to obtain a given theoretical homogeneity in a sphere centred on the origin of radius $a < a_1$, all $Z_{2p}$ terms must be cancelled for $1 \leq p \leq p_0$. It is evidently sought to do so in the most economical way possible.

For obvious reasons (installation, use, external perturbations ...) it is sought to limit the external field generated by the magnet ("stray field"). The theoretical method is similar to the one used for homogeneity but a so-called external ESH is used that is valid outside the smallest sphere of centre O and not containing any current or magnetized material:

$$B_z = \sum_{p=1}^{\infty} M_{2q} \frac{1}{r^{2q+1}} P_{2q}(\cos\vartheta)$$

The coefficients of this ESH are called "moments" of current distribution and the first thereof, $M_2$, is the dipole moment.

The first step to be taken to reduce the external field is to cancel the dipole moment, which involves the use of currents rotating around Oz in opposite direction to those which produce the field in the volume of interest, which therefore contributes towards a reduction thereof.

A superconducting magnet configuration has already been proposed in document US 2009/0261246 A1, comprising a main superconducting coil of length $L_1$ having symmetry of rotation about an axis z to set up a main magnetic field in an inner space, and an external auxiliary superconducting coil coaxial to the main superconducting coil, of length $L_2$ shorter than length $L_1$, and having symmetry of rotation about the axis z so as to set up, within the inner space, a field of opposite direction to that of field set up by the main superconducting coil. The superconducting magnet configuration also comprises rings in ferromagnetic material which are arranged in the inner volume defined by the main superconducting coil to allow compensations and to increase the homogeneity of the magnetic field in the volume of interest.

With said device it is therefore possible to improve the homogeneity of the magnetic field in the volume of interest, at the cost of an increase in weight due to the rings in ferromagnetic material, and above all at the cost of restriction of the free space within the volume of interest since the rings in ferromagnetic material are arranged inside the free space defined by the main superconducting coil. If it is desired to maintain the same free space for the volume of interest, the overall dimensions of the whole device must be increased by increasing the diameter of the superconducting coils, which is detrimental to compactness and increases manufacturing costs.

DEFINITION AND SUBJECT OF THE INVENTION

The present invention sets out to overcome the above-mentioned shortcomings and to allow a superconducting magnet device to be produced that is more compact than existing devices whilst being easy to produce and allows an intense, very homogeneous magnetic field to be obtained in a volume of interest, which can be used in particular for NMR or MRI applications.

By intense magnetic field is meant a magnetic field of at least 0.5 T, preferably of 1 T or higher, and which in some embodiments can exceed 10 T.

The invention also sets out to define a method for producing such device which is simplified but nonetheless allows optimized homogenization to be obtained of the magnetic field set up in the volume of interest.

These objectives are reached according to the invention by means of a compact superconducting magnet device for generating a homogeneous magnetic field component Bz along an axis Oz in a zone of interest ZI for nuclear magnetic resonance or magnetic resonance imaging applications successively comprising, starting from the axis Oz and in a direction perpendicular to this axis Oz, at least one first helical superconducting coil formed around a first circular cylinder section of axis Oz delimited by first end circles, said first helical superconducting coil having a first outer radius $a_{12}$, a first inner radius $a_{11}$ and a first length $2b_1$, with a first azimuthal current density $j_1$, at least one second helical superconducting coil formed around a second circular cylinder section of axis Oz delimited by second end circles, and surrounding said first circular cylinder section, said second coil having a second outer radius $a_{22}$, a second inner radius $a_{21}$ and a second length $2b_2$ with a second azimuthal current density $j_2$, characterized in that the lateral ends of the first and second helical coils are arranged, to within the thickness of the coils, in the vicinity of one same sphere of radius c whose centre O is positioned on the axis Oz in the centre of said zone of interest ZI and which encompasses the whole magnet device, in that it further comprises at least one third superconducting helical coil formed around a third circular cylinder section of axis Oz delimited by third end circles and surrounding said second circular cylinder section, said third coil having a third outer radius $a_{32}$, a third inner radius $a_{31}$ and a third length $2b_3$, with a third azimuthal current density $j_3$, in that said first, second and third azimuthal current densities $j_1$, $j_2$, $j_3$ are alternately of opposite sign, in that the first, second and third lengths $2b_1$, $2b_2$, $2b_3$ of the first, second and third coils are of decreasing length, and in that the outer radius $a_{32}$ of the outermost superconducting helical coil is substantially equal to the half-length b1 of the innermost superconducting helical coil and in that the outer radius $a_{12}$ of the innermost superconducting helical coil is substantially equal to the half-length $b_3$; $b_4$ of the outermost superconducting helical coil.

According to one particular embodiment, the compact superconducting magnetic device further comprises at least one fourth superconducting helical coil formed around a fourth circular cylinder section of axis Oz delimited by fourth end circles and surrounding said third circular cylinder section, said fourth superconducting helical coil having a fourth outer radius $a_{42}$, a fourth inner radius $a_{41}$, and a fourth length $2b_4$, with a fourth azimuthal current density $j_4$. The first, second, third and fourth azimuthal current densities $j_1$, $j_2$, $j_3$, $j_4$ are alternately of opposite sign, and the first, second, third and fourth lengths $2b_1$, $2b_2$, $2b_3$, $2b_4$ of the first, second, third and fourth superconducting helical coils are of decreasing length.

The invention also concerns a method for producing a compact superconducting magnet device to generate a homogeneous magnetic field component Bz along an axis Oz in a zone of interest ZI for nuclear magnetic resonance or magnetic resonance imaging applications, characterized in that it comprises the following steps:

a) determining a first circular cylinder section of axis Oz delimited by first end circles and having a first predefined radius a1 and a first predefined length $2b_1$ respectively corresponding to the minimum radius and maximum length of said zone of interest ZI, b) determining a last circular cylinder section of axis Oz delimited by last end circles, surrounding said first circular cylinder section and having a last predefined radius $a_3$; $a_4$ and a last predefined length $2b_3$; $2b_4$ respectively corresponding to the maximum length $2b_1$ and minimum radius $a_1$ of said zone of interest ZI, c) determining at least one intermediate circular cylinder section of axis Oz delimited by end circles, inserted between said first circular cylinder section and said last circular cylinder section, and having an intermediate predefined radius $a_2$; $a_3$ of between the minimum radius a1 of said zone of interest and the last predefined radius $a_3$; $a_4$ and an intermediate predefined length $2b_2$; $2b_3$ of between said last predefined length $2b_3$; $2b_4$ and said maximum length $2b_1$, so that the first end circles, the intermediate end circles and the last end circles are positioned on one same sphere of centre O and radius c, d) considering a first surface current sheet formed on the first circular cylinder section of axis Oz, at least one intermediate surface current sheet formed on the intermediate circular cylinder section of axis Oz and a last thin surface current sheet formed on the last circular cylinder section of axis Oz, the successive coaxial surface current sheets each having a surface azimuthal current density $\kappa_i$ such that two adjacent coaxial surface current sheets have surface azimuthal current densities of opposite sign, and determining the location of the intermediate circular cylinder section(s) so as to optimize the homogeneity of the magnetic field in said zone of interest ZI, e) replacing the successive coaxial surface current sheets by axisymmetric superconducting helical coils with rectangular axial half-section of nonzero thickness such that the lateral ends of the helical coils are arranged, to within the thickness of the coils, in the vicinity of one same sphere of radius c whose centre O is placed on the axis Oz in the centre of said zone of interest ZI and which encompasses the whole magnet device.

According to one particular embodiment of the method conforming to the invention, at aforementioned step c) a single intermediate circular cylinder section is determined, at aforementioned step d) a single intermediate surface current sheet is determined and at aforementioned step e) a single intermediate axisymmetric superconducting helical coil is determined with rectangular axial half-section of nonzero thickness replacing the single intermediate surface current sheet.

According to another particular embodiment of the method conforming to the invention, at aforementioned step c) two intermediate circular cylinder sections are determined, at aforementioned step d) two intermediate surface current sheets are determined and at aforementioned step e) two intermediate axisymmetric superconducting helical coils are determined with rectangular axial half-section of nonzero thickness replacing said two intermediate surface current sheets.

BRIEF DESCRIPTION OF THE DRAWINGS

Other characteristics and advantages of the invention will become apparent from the following description of particular embodiments of the invention given as examples and with reference to the appended drawings in which.

Figure 1:
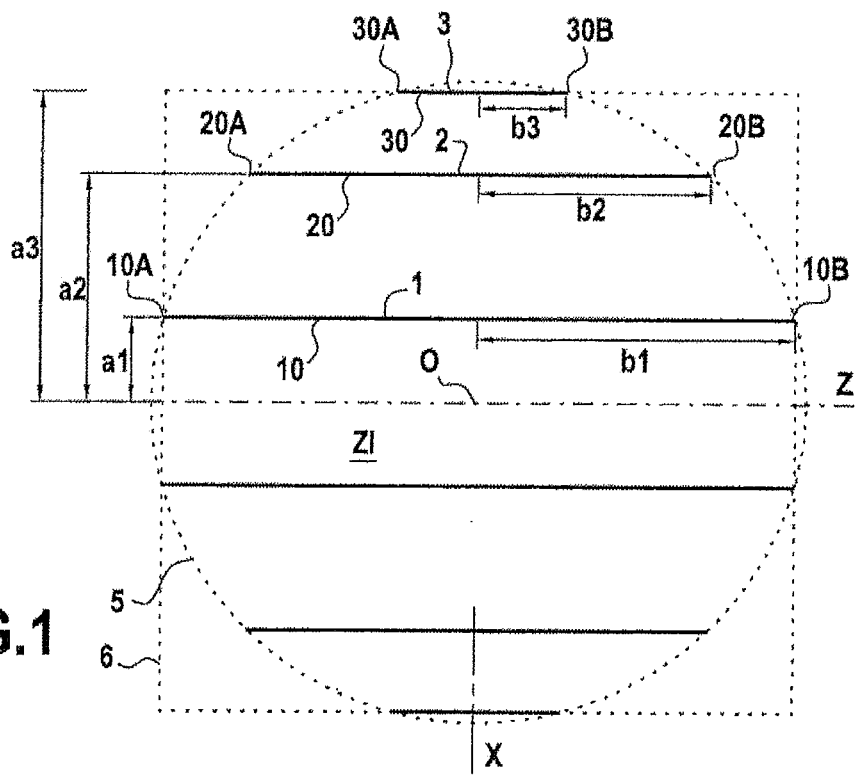
FIG. 1 is a schematic view of a magnetic device at a step for preparing a first embodiment of the invention with three thin solenoids.

created by the device in FIG. 1 along axis Oz; and

Figures 4A, 4B:
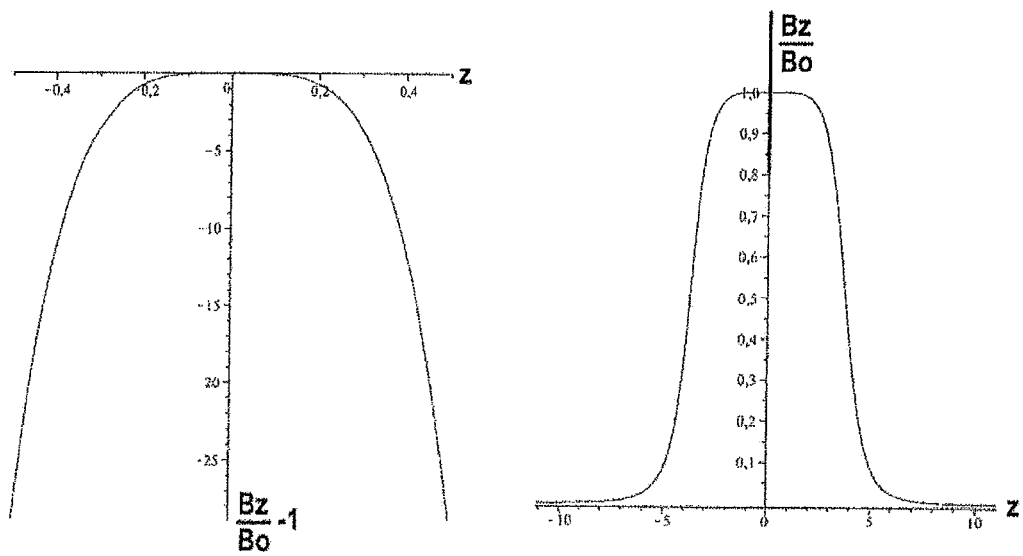
FIG. 4A gives the profile of the relative magnetic field $$\frac{B_z}{B_0} - 1$$

FIG. 4B gives the profile of the magnetic field $$\frac{B_z}{B_0}$$

created by the device in FIG. 1 along axis Oz.

DETAILED DESCRIPTION OF PREFERRED EMBODIMENTS

According to the invention, the method for optimizing magnet structures formed of axisymmetric coils with rectangular axial half-section comprises a first step which entails not taking into account the thickness of the coils. It has effectively been found that taking into account the thickness of the coils ab inibo leads to cumbersome calculations and does not allow easy apprehending of the essential characteristics of the structure.

According to the invention, consideration is therefore given, at a first step, to configurations having surface current sheets carried by circular cylinders of axis Oz. In the remainder of the description, said current sheet will be called a "thin solenoid" without further details.

Each thin solenoid is characterized by its radius a, dimensions $b_1$ and $b_2$ of its first and second ends allowing the defining of a length $2b$ or half-length b, and by the surface density of the azimuthal current density κ it carries, measured algebraically around Oz. The following denotations are used:

$$c = \sqrt{a^2 + b^2}$$
$$\sin\alpha = \frac{a}{c}$$
$$\cos\alpha = \frac{b}{c}$$

The inner and outer coefficients of expansion in spherical harmonics expansion (ESH) are obtained using the following expressions:

$$Z_0 = \frac{\mu_0 \kappa}{2}[\cos\alpha]_{b_1}^{b_2}$$

$$Z_{n\geq 1} = -\frac{\mu_0 \kappa}{2n}\left[\frac{1}{c^n}\sin\alpha P_n^1(\cos\alpha)\right]_{b_1}^{b_2}$$

$$M_{n\geq 2} = \frac{\mu_0 \kappa}{2(n+1)}[c^{n+1}\sin\alpha P_n^1(\cos\alpha)]_{b_1}^{b_2}$$

It is recalled that $M_0=0$ since Maxwell's equations were written so as to cause the magnetic charges to disappear only leaving the electric charges to subsist (no magnetic "monopoly"). Also, the expression of $M_n$ above leads to $M_1=0$ and the first nonzero moment is theoretically the dipole moment, the general property of any current distribution.

These expressions reveal a remarkable property. If an assembly of such coaxial solenoids is considered, whose end circles are positioned on one same sphere of radius c, each solenoid is then only characterized by two parameters $\alpha_i$ and $\kappa_i$. This configuration can be termed "circumspherical". To produce a homogeneous magnet, these parameters are chosen for simultaneous cancellation of the $Z_{2n}$ terms (the terms of odd degree are zero on account of symmetry relative to xOy) up to degree $2n_0$, the moments $M_{2n}$ will also all be cancelled up to the same degree. By improving homogeneity, the external field here is therefore concomitantly reduced.

With the use of two solenoids it is possible to cancel $Z_2$ and hence simultaneously $M_2$. According to the invention, a configuration with three or four solenoids is used which allows an improvement in homogeneity without having to add iron rings in the volume of interest positioned inside the inner solenoid.

FIG. 1 illustrates a circumspherical magnet according to the invention in its configuration with three thin solenoids 1, 2, 3 arranged coaxially about the axis Oz from inside to outside.

The circumspherical configuration with three solenoids depends on 5 parameters if the subscripts 1, 2 and 3 respectively are allocated to each of the thin solenoids:

$$\alpha_1, \alpha_2, \alpha_3$$
$$\frac{\kappa_2}{\kappa_1}, \frac{\kappa_3}{\kappa_1}$$

It is possible to meet two (and no more!) conditions of homogeneity:

$$Z_2=Z_4=0$$

which will lead to cancellation of the dipole moment and of the quadrupole moment. $\alpha_1$ is fixed a priori by the effective inner radius $a_1$ of the thin solenoid 1 which corresponds to a circular cylinder section 10 of axis Oz limited by end circles 10A, 10B (i.e. a cylinder portion 10 limited by two planes perpendicular to the generating lines of the cylinder) and delimiting a zone of interest ZI which is to be left free and subjected to a magnetic field that is the most homogeneous possible, $\alpha_3$ is fixed a priori by the outer radius<c not to be exceeded for the outermost thin solenoid 3.

There therefore remains a degree of freedom and hence possible optimization. The governing magnitude thereof is the factor of quality whose general expression for a circumspherical configuration of thin solenoids is the following:

$$Q = \frac{\sin^2\alpha_1 \left|\sum_i \kappa_i \cos\alpha_i\right|}{\sum_i |\kappa_i|\sin\alpha_i\cos\alpha_i}$$

It is sufficient to maximize Q paying heed to the abovementioned constraints for full determination of the configuration.

If, as an example, the following values are imposed for the first and third solenoids:

$$a_1 = 1\ m \atop b_1 = 3.7\ m \to \alpha_1 = 0.263964$$

$$\alpha_3 = \frac{\pi}{2} - \alpha_1 \to {a_3 = 3.7\ m \atop b_3 = 1\ m}$$

It is ascertained that a "square" assembly 6 is defined whose length $2b_1$ is equal to the outer diameter $2a_3$ of the third solenoid 3.

The optimal solution is then deduced for the second intermediate solenoid 2, and in this example it comes to be following:

$$\alpha_2 = 0.790145 \to {a_2 = 2.723001\ m \atop b_2 = 2.697270\ m}$$

$$\frac{\kappa_2}{\kappa_1} = -0.259402$$

$$\frac{\kappa_3}{\kappa_1} = 0.108687$$

$$B_0 = 0.811169\ \mu_0 \kappa_1$$

$$Q = 0.135029$$

In FIG. 1, the three solenoids 1, 2, 3 each defined by a cylinder section 10, 20, 30 respectively limited by end circles 10A, 10B, 20A, 20B, 30A, 30B essentially positioned on a sphere 5 of radius c, have surface azimuthal current densities of alternate opposite signs. For example the solenoids 1 and 3 have a surface azimuthal current density κ>0 whilst the intermediate solenoid 2 has a surface azimuthal current density κ<0. The curves in FIGS. 4A and 4B show the homogeneity obtained: The curve in FIG. 4A shows the relative field profile $$\frac{B_z}{B_0} - 1$$

on the axis Oz in ppm and the curve in FIG. 4B shows the field profile $$\frac{B_z}{B_0}$$

also on the axis Oz where $B_z$ is the intensity of the field along axis Oz.

Figure 2:
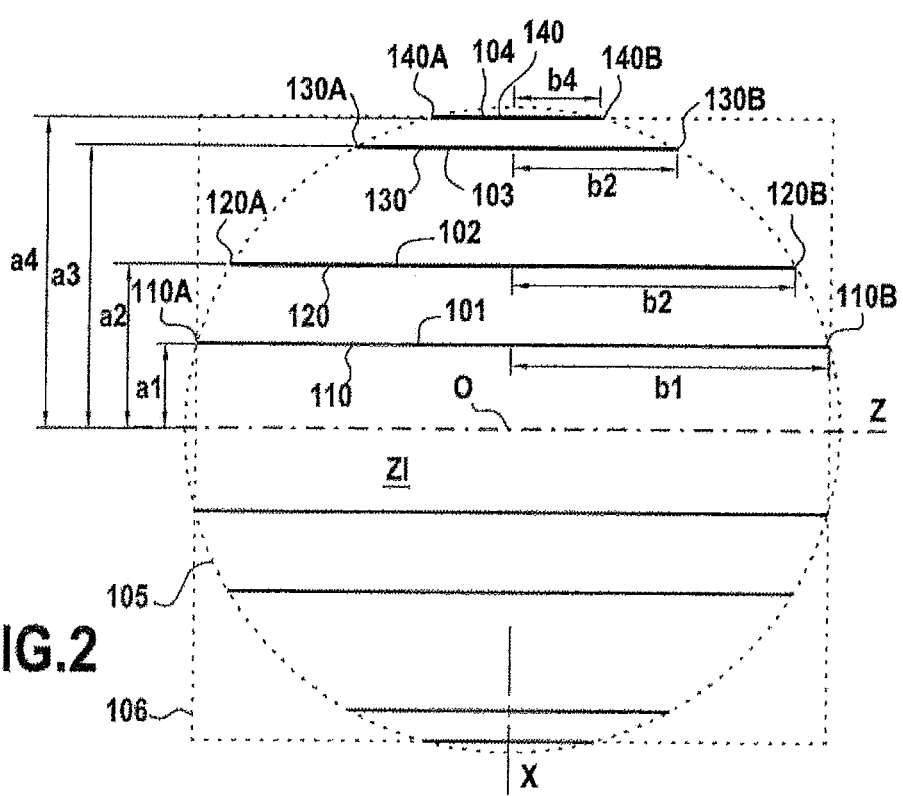
FIG. 2 is a schematic view of a magnet device at a step for preparing a second embodiment of the invention with four thin solenoids.

A description is now given with reference to FIG. 2 of a circumspherical magnet according to the invention in its configuration with four thin solenoids 101, 102, 103, 104 arranged coaxially around the axis Oz from inside to outside.

The circumspherical configuration with four solenoids depends on 7 parameters if the subscripts 101, 102, 103 and 104 are respectively allocated to each of the thin solenoids:

$$\alpha_1, \alpha_2, \alpha_3, \alpha_4$$

$$\frac{\kappa_2}{\kappa_1}, \frac{\kappa_3}{\kappa_1}, \frac{\kappa_4}{\kappa_1}$$

Three (and no more!) conditions of homogeneity can be met:

$$Z_2 = Z_4 = Z_6 = 0$$

which will lead to cancellation of the dipole moment, of the quadrupole moment and of the hexapole moment.

$\alpha_1$ is fixed a priori by the effective inner radius $a_1$ of the thin solenoid 101 which corresponds to a circular cylinder section 110 of axis Oz limited by end circles 110A, 110B and delimiting a zone of interest ZI to be left free and subjected to a magnetic field the most homogeneous possible, $\alpha_3$ is fixed a priori by the outer radius<c not to be exceeded for the outermost thin solenoid 104.

There then remains two degrees of freedom which will be uniquely determined by maximizing the quality factor Q With the same "square" form and the same values of a volume 106 of square cross-section as for the preceding example, we have:

$$a_1 = 1\ m \atop b_1 = 3.7\ m \to \alpha_1 = 0.263964$$

$$\alpha_4 = \frac{\pi}{2} - \alpha_1 \to {a_4 = 3.7\ m \atop b_4 = 1\ m}$$

$$\alpha_2 = 0.530326 \to {a_2 = 1.938663\ m \atop b_2 = 3.306295\ m}$$

$$\alpha_3 = 1.058012 \to {a_3 = 3.339793\ m \atop b_3 = 1.880369\ m}$$

$$\frac{\kappa_2}{\kappa_1} = -0.459351$$

$$\frac{\kappa_3}{\kappa_1} = 0.150085$$

$$\frac{\kappa_4}{\kappa_1} = -0.0832578$$

$$B_0 = 0.621018\ \mu_0 \kappa_1$$

$$Q = 0.078660$$

In FIG. 2, the four solenoids 101, 102, 103, 104 each defined by a cylinder section 110, 120, 130, 140 respectively limited by end circles 110A, 110B, 120A, 120B, 130A, 130B, 140A, 140B essentially positioned on a sphere 105 of radius c, have surface azimuthal current densities of alternate opposite sign. Therefore, for the solenoids 101 and 103 for example the surface azimuthal current density is κ>0 whilst for the intermediate solenoid 102 and the last solenoid 104 the surface azimuthal current density is κ<0. With the configuration in FIG. 2, there is a decrease in the field coefficient and the quality factor. Curves similar to those in FIGS. 4A and 4B show that there is a distinct improvement in homogeneity, whilst the cancelling of an additional moment does not modify to the same extent the already very marked reduction of the external field.

It is noted that homogeneity is much better than would be obtained with a conventional configuration of four solenoids having the same radius and same total length and with the following dimensions (it will be noticed that the three empty intervals are very narrow):

$$a = 1\ m$$

$$b_1 = \pm 3.7\ m$$

$$b_2 = \pm 0.508629\ m$$

$$b_3 = \pm 0.497528\ m$$

$b_4 = \pm 0.00453561$ m $B_0 = 0.952914 \, \mu_0 \kappa$ $Q = 0.258637$

The homogeneity of the circumspherical configuration in FIG. 2 with coaxial solenoids of increasing radius $a_1$, $a_2$, $a_3$, $a_4$, is much better than that of a conventional configuration with four solenoids of same radius $a = a_1$, since the currents in opposite direction which allow the cancelling of $Z_2$, $Z_4$ and $Z_6$ lead to a most significant reduction in the following coefficients, which would not occur with a conventional configuration.

According to the invention, after determining the desired configuration with three or four thin solenoids as previously indicated with reference to FIGS. 1 and 2, the successive coaxial surface current sheets are replaced by axisymmetric superconducting helical coils with rectangular axial half-section of nonzero thickness 1, 2, 3 or 101, 102, 103, 104 such that the lateral ends of the helical coils 1, 2, 3 or 101, 102, 103, 104 remain arranged in the vicinity of one same sphere 5 or 105 of radius c whose centre O is placed on the axis Oz in the centre of the zone of interest ZI and which encompasses the magnet device assembly.

In this manner a true circumspherical magnet device is obtained with coils of finite thickness. The changeover from the preceding ideal solutions determined at a first step to real configurations is then very simple at this stage. All that is required is to replace the thin solenoids by coils with rectangular axial semi-section whose thickness is now finite.

We are faced here with a conventional problem of optimization in which geometrical parameters are fixed (inner coil radius $a_{11}$, maximum outer radius $a_{32}$, maximum total length $2b_1$) and the overall current densities for the coils, with or without gradation. The geometrical data obtained for the ideal configurations having the same number of coils provide the necessary starting values, in particular the thicknesses $e_i$ of the true coils with current density $j_i$ where $j_i e_i \approx \kappa_i$.

Figure 3:
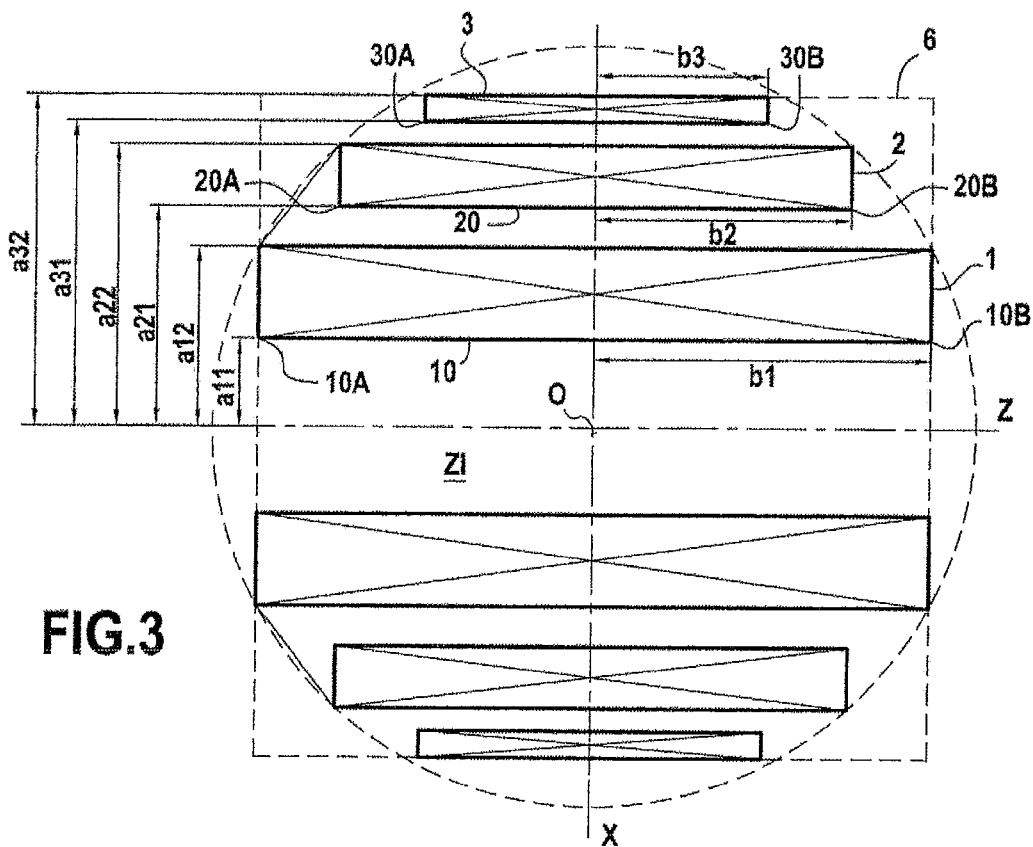
FIG. 3 is a schematic view of a magnet device of the invention with three solenoids of rectangular axial half-section of significant thickness.

FIG. 3 illustrates an example of a superconducting magnet device of the invention with three actual coils 1, 2, 3 formed around cylinder sections respectively 10, 20, 30 limited by end circles 10A, 10B, 20A, 20B, 30A, 30B, the three actual coils 1, 2, 3 with rectangular axial half-section respectively having a half-length $b_1$, $b_2$, $b_3$, an outer radius $a_{12}$, $a_{22}$, $a_{32}$ and an inner radius $a_{11}$, $a_{21}$, $a_{31}$. The actual coils 1, 2, 3 have azimuthal current densities $j_1$, $j_2$, $j_3$ of alternate opposite sign.

Examples of numerical values are given below for a circumspherical configuration with three coils allowing an intense, homogeneous magnetic field to be obtained, which takes up less space than known devices already proposed to obtain such magnetic field values within an effective volume of a zone of interest ZI of radius 0.5 m. Here an outer radius and a half-length of 1.85 m are defined.

The values of the inner radius $a_1$, of the outer radius $a_2$, of the half-length b and of the azimuthal current density j are successively given below for each of the coils 1, 2, 3:

| $a_1$ (m) | $a_2$ (m) | b (m) | j (A/mm²) |
|---|---|---|---|
| 0.5 | 0.993841 | 1.85 | 35 |
| 1.238087 | 1.570660 | 1.445131 | −42 |
| 1.705922 | 1.85 | 0.963238 | 49 |

$B_0 = 11.7436$ T
$V_S = 20.158$ m³
$Z_2 = Z_4 = 0$
$M_2 = M_4 = 0$

Six parameters are fixed in advance, namely the inner radius $a_1$ (also denoted $a_{11}$) of coil 1, the outer radius $a_2$ (also denoted $a_{32}$) of coil 3, the half-length b (also denoted $b_1$) of coil 1 and the azimuthal current densities j of the three coils 1 to 3 (with for the intermediate coil 2 an opposite sign to that of the two other coils 1 and 3) and the 6 other parameters given in the Table are the result of optimization.

The dotted line in FIG. 3 traces the outline of the smallest sphere 5 and the (square) outline of the smallest cylinder 6 encompassing the magnet.

Since strictly only the two first inner ESH coefficients have been cancelled, it could be expected that this magnet would not be very homogeneous. This is not at all the case however and homogeneity is most satisfactory. We effectively have:

$Z_6 = -0.019$ ppm@$r_0 = 0.11$ m and all the other coefficients lower than one ppb. If $r_0 = 0.2$ m is used to better reveal the nonzero coefficients, we find that the only ones higher than one ppb are:

$Z_6 = -0.697$ ppm $Z_8 = -0.005$ ppm

The limiting of the external field is also excellent since the 5 gauss line lies at 7.95 m on the axis and at 6.645 m in the perpendicular plane.

An actual magnet device with four coils that are essentially axisymmetric with rectangular axial half-section was prepared using the same process starting from the ideal configuration determined with configurations containing surface current sheets carried by circular cylinders of axis Oz such as illustrated in FIG. 2.

According to the invention, initially an assembly of thin solenoids is used so that it is possible simultaneously and automatically to solve the problem of homogeneity and stray field reduction, the imposed condition then being simple and lying in the need that the end circles of the thin solenoids should be substantially positioned on the same sphere. A thin solenoid being a theoretical ideal, whereas in a true coil a certain thickness is evidently needed to pass the current, even in a superconductor of the invention, the solution obtained with thin solenoids is developed by making them thicker via an optimization process as indicated above. Under these conditions, none of the end circles of the thick solenoids (that of the inner radius and that of the outer radius) can continue to be strictly positioned on the same sphere, but these end circles remain in the vicinity of a sphere corresponding to the ideal case with thin solenoids, the vicinity of the end circles relative to the sphere being closer the thinner the solenoids. On the other hand, despite this less close vicinity it is possible, for the assembly of actual thick solenoids, to maintain the same properties of homogeneity and stray field as for the assembly of thin solenoids, by suitably choosing the inner and outer radii (which surround the radius of the corresponding thin solenoid) and the lengths (each also being close to that of the corresponding thin solenoid) the whole globally remaining approximately inscribed within a sphere.

The superconducting magnet device of the invention can be implemented irrespective of the desired field value. It can in particular be used to obtain an intense, homogeneous magnetic field component Bz of 10 or 11 Teslas for example.

To summarize, the compact superconducting magnet device to generate a homogeneous, intense magnetic field component Bz along an axis Oz in a zone of interest ZI, successively comprises—starting from the axis Oz—at least three coaxial superconducting helical coils 1, 2, 3 formed around circular cylinder sections 10, 20, 30 of axis Oz delimited by end circles 10A, 10B, 20A, 20B, 30A, 30B. The lateral ends of the helical coils 1, 2, 3 (or 101 to 104) are arranged, to within the thickness of the coils, in the vicinity of one same sphere 5 (or 105) of radius c whose centre O is placed on the axis Oz in the centre of the zone of interest ZI and which encompasses the magnet device assembly. The azimuthal current densities $j_1, j_2, j_3$ of the helical coils 1, 2, 3 (or 101 to 104) are alternately of opposite sign. The lengths $2b_1, 2b_2, 2b_3$ (and optionally $2b_4$) of the helical coils 1, 2, 3 (or 101 to 104) are of decreasing length. The outer radius $a_{32}$ of the outermost superconducting helical coil 3 (or 104) is substantially equal to the half-length $b_1$ of the innermost superconducting helical coil 1 (or 101), and the outer radius $a_{12}$ of the innermost superconducting helical coil 1 (or 101) is substantially equal to the half-length $b_3$ (or $b_4$) of the outermost superconducting helical coil 3 (or 104).

The invention claimed is:

1. A compact superconducting magnet device to generate a homogeneous magnetic field component Bz along an axis Oz in a zone of interest (ZI) for nuclear magnetic resonance or magnetic resonance imaging applications, successively comprising, starting from the axis Oz and perpendicular to this axis Oz, at least one first superconducting helical coil (1; 101) formed around a first circular cylinder section (10; 110) of axis Oz delimited by first end circles (10A, 10B; 110A, 110B), said first superconducting helical coil (1; 101) having a first outer radius ($a_{12}$), a first inner radius ($a_{11}$), and a first length ($2b_1$), with a first azimuthal current density $j_1$, at least one second superconducting helical coil (2; 102) formed around a second circular cylinder section (20; 120) of axis Oz delimited by second end circles (20A, 20B; 120A, 120B) and surrounding said first circular cylinder section (10; 110), said second coil (2; 102) having a second outer radius ($a_{22}$), a second inner radius ($a_{21}$) and a second length ($2b_2$), with a second azimuthal current density $j_2$, characterized in that the lateral ends of the first and second helical coils (1, 2; 101, 102) are arranged, to within the thickness of the coils, in the vicinity of one same sphere (5; 105) of radius c whose centre O is placed on the axis Oz in the centre of said zone of interest (ZI) and which encompasses the magnet device assembly, in that it further comprises at least one third superconducting helical coil (3; 103) formed around a third circular cylinder section (30; 130) of axis Oz delimited by third end circles (30A, 30B; 130A, 130B) and surrounding said second circular cylinder section (20; 120), said third coil (3; 103) having a third outer radius ($a_{32}$), a third inner radius ($a_{31}$) and a third length ($2b_3$), with a third azimuthal current density $j_3$, in that said first, second and third azimuthal current densities $j_1, j_2, j_3$ are of alternate opposite sign, in that the first, second and third lengths ($2b_1, 2b_2, 2b_3$) of the first, second and third coils (1, 2, 3; 101, 102, 103) are of decreasing length, in that the outer radius ($a_{32}$) of the outermost superconducting helical coil (3; 104) is substantially equal to the half-length ($b_1$) of the innermost superconducting helical coil (1; 101) and in that the outer radius ($a_{12}$) of the innermost superconducting helical coil (1; 101) is substantially equal to the half-length ($b_3$; $b_4$) of the outermost superconducting helical coil (3; 104).

2. The magnet device according to claim 1, characterized in that it further comprises at least one fourth superconducting helical coil (104) formed around a fourth circular cylinder section (140) of axis Oz delimited by fourth end circles (140A, 140B) and surrounding said third circular cylinder section (130), said fourth superconducting helical coil (104) having a fourth outer radius ($a_{42}$), a fourth inner radius ($a_{41}$) and a fourth length ($2b_4$), with a fourth azimuthal current density $j_4$, in that the first, second, third and fourth azimuthal current densities $j_1, j_2, j_3, j_4$ are alternately of opposite sign, and in that the first, second, third and fourth lengths ($2b_1, 2b_2, 2b_3, 2b_4$) of the first, second, third and fourth superconducting helical coils (101, 102, 103, 104) are of decreasing length.

3. A method for producing a compact superconducting magnet device to generate a homogeneous magnetic field component Bz along an axis Oz in a zone of interest ZI for nuclear magnetic resonance or magnetic resonance imaging applications, characterized in that it comprises the following steps:
   a. determining a first circular cylinder section (10; 110) of axis Oz delimited by first end circles (10A, 10B; 110A, 110B) and having a first predefined radius ($a_1$) and a first predefined length ($2b_1$) respectively corresponding to the minimum radius and the maximum length of said zone of interest ZI,
   b. determining a last circular cylinder section (30; 140) of axis Oz delimited by last end circles (30A, 30B; 140A, 140B), surrounding said first circular cylinder section (10; 110) and having a last predefined radius ($a_3$; $a_4$) and a last predefined length ($2b_3$; $2b_4$) respectively corresponding to the maximum length ($2b_1$) and minimum radius ($a_1$) of said zone of interest ZI,
   c. determining at least one intermediate circular cylinder section (20; 120, 130) of axis Oz delimited by intermediate end circles (20A, 20B; 120A, 120B, 130A, 130B), inserted between said first circular cylinder section (10; 110) and said last cylinder section (30; 140), and having an intermediate predefined radius ($a_2$; $a_3$) of between the minimum radius ($a_1$) of said zone of interest and the last predefined radius ($a_3$; $a_4$) and an intermediate predefined length ($2b_2$; $2b_3$) of between said last predefined length ($2b_3$; $2b_4$) and said maximum length ($2b_1$), so that the first end circles (10A, 10B; 110A, 110B), the intermediate end circles (20A, 20B; 120A, 120B, 130A, 130B) and the last end circles (30A, 30B; 140A, 140B) are positioned on one same sphere of centre O and radius c,
   d. considering a first surface current sheet formed on the first circular cylinder section (10; 110) of axis Oz, at least one intermediate surface current sheet formed on the intermediate circular cylinder section (20; 120, 130) of axis Oz and a last thin surface current sheet formed on the last circular cylinder section (30; 140) of axis Oz, the successive coaxial surface current sheets each having a surface azimuthal current density $\kappa_1$ such that two adjacent coaxial surface current sheets have surface azimuthal current densities of opposite sign, and determining the location of the intermediate circular cylinder section(s) (20; 120, 130) so as to optimize the homogeneity of the magnetic field in said zone of interest ZI,
   e. replacing the successive coaxial surface current sheets by axisymmetric superconducting coils with rectangular axial half-section of nonzero thickness (1, 2, 3; 101, 102, 103, 104) such that the lateral ends of the helical coils (1, 2, 3; 101, 102, 103, 104) are arranged, to within the thickness of the coils, in the vicinity of one same sphere (5; 105) of radius c whose centre O is placed on the axis Oz at the centre of said zone of interest ZI and which encompasses the magnet device assembly.

4. The method according to claim 3, characterized in that at aforementioned step c) a single intermediate cylinder section (20) is determined, at aforementioned step d) a single intermediate surface current sheet is determined, and at aforementioned step e) a single intermediate axisymmetric superconducting helical coil (2) is determined with rectangular axial half-section and nonzero thickness replacing the single intermediate surface current sheet.

5. The method according to claim 3, characterized in that at aforementioned step c) two intermediate cylinder sections (120, 130) are determined, at aforementioned step d) two intermediate surface current sheets are determined and at aforementioned step e) two intermediate axisymmetric superconducting helical coils (102, 103) are determined with rectangular axial half-section and nonzero thickness replacing said two intermediate surface current sheets.

* * * * *